United States Patent
Clark

(10) Patent No.: US 8,633,118 B2
(45) Date of Patent: Jan. 21, 2014

(54) METHOD OF FORMING THIN METAL AND SEMI-METAL LAYERS BY THERMAL REMOTE OXYGEN SCAVENGING

(75) Inventor: Robert D Clark, Livermore, CA (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 13/363,765

(22) Filed: Feb. 1, 2012

(65) Prior Publication Data

US 2013/0196515 A1  Aug. 1, 2013

(51) Int. Cl.
*H01L 21/31* (2006.01)

(52) U.S. Cl.
USPC ........... 438/763; 438/240; 438/241; 438/275; 438/287; 438/981; 257/E21.006; 257/E21.19

(58) Field of Classification Search
USPC ......... 438/591, 275, 240–241, 287, 981, 763; 257/E21.006, E21.19
See application file for complete search history.

(56) References Cited

U.S. PATENT DOCUMENTS

| | | | |
|---|---|---|---|
| 6,407,435 B1 | 6/2002 | Ma et al. | |
| 6,617,639 B1 | 9/2003 | Wang et al. | |
| 6,642,131 B2 | 11/2003 | Harada | |
| 6,939,611 B2 * | 9/2005 | Fujishima et al. | 428/432 |
| 7,091,568 B2 | 8/2006 | Hegde et al. | |
| 7,176,531 B1 | 2/2007 | Xiang et al. | |
| 7,226,831 B1 * | 6/2007 | Metz et al. | 438/216 |
| 7,446,380 B2 | 11/2008 | Bojarczuk et al. | |
| 7,772,073 B2 | 8/2010 | Clark et al. | |
| 7,888,195 B2 | 2/2011 | Lin et al. | |
| 7,952,118 B2 | 5/2011 | Jung et al. | |
| 8,012,827 B2 | 9/2011 | Yu et al. | |
| 8,202,773 B2 | 6/2012 | Niimi et al. | |
| 2002/0047170 A1 | 4/2002 | Ota | |
| 2002/0172768 A1 | 11/2002 | Endo et al. | |
| 2003/0052374 A1 | 3/2003 | Lee et al. | |
| 2005/0098839 A1 | 5/2005 | Lee et al. | |
| 2005/0238886 A1 * | 10/2005 | Gallego | 428/428 |
| 2005/0245016 A1 | 11/2005 | Pan et al. | |
| 2006/0054943 A1 | 3/2006 | Li et al. | |
| 2006/0081901 A1 * | 4/2006 | Arimoto et al. | 257/295 |
| 2006/0118890 A1 | 6/2006 | Li | |
| 2006/0151823 A1 | 7/2006 | Govindarajan | |
| 2006/0189154 A1 | 8/2006 | Ahn et al. | |
| 2006/0189156 A1 * | 8/2006 | Doczy et al. | 438/778 |
| 2006/0289948 A1 | 12/2006 | Brown et al. | |
| 2007/0032021 A1 * | 2/2007 | Park | 438/275 |

(Continued)

OTHER PUBLICATIONS

Xinyuan Zhao, et al., "First-Principles Study of Electronic and Dielectric Properties of ZrO2 and HfO2", Mat. Res. Soc. Symp. Proc. vol. 745 .COPYRGT. 2003 Materials Research Society, pp. 283-289.

(Continued)

*Primary Examiner* — N Drew Richards
*Assistant Examiner* — Ankush Singal

(57) ABSTRACT

Methods for forming thin metal and semi-metal layers by thermal remote oxygen scavenging are described. In one embodiment, the method includes forming an oxide layer containing a metal or a semi-metal on a substrate, where the semi-metal excludes silicon, forming a diffusion layer on the oxide layer, forming an oxygen scavenging layer on the diffusion layer, and performing an anneal that reduces the oxide layer to a corresponding metal or semi-metal layer by oxygen diffusion from the oxide layer to the oxygen scavenging layer.

21 Claims, 4 Drawing Sheets

(56) References Cited

U.S. PATENT DOCUMENTS

| | | | |
|---|---|---|---|
| 2007/0085154 A1* | 4/2007 | Murakawa et al. | 257/411 |
| 2007/0178634 A1 | 8/2007 | Jung et al. | |
| 2007/0237697 A1 | 10/2007 | Clark | |
| 2008/0081113 A1 | 4/2008 | Clark | |
| 2008/0116543 A1* | 5/2008 | Govindarajan | 257/639 |
| 2008/0121963 A1* | 5/2008 | Govindarajan | 257/310 |
| 2009/0047798 A1 | 2/2009 | Clark et al. | |
| 2009/0108294 A1 | 4/2009 | Choi et al. | |
| 2009/0152650 A1 | 6/2009 | Chudzik et al. | |
| 2010/0044806 A1* | 2/2010 | Hou et al. | 257/412 |
| 2010/0048010 A1* | 2/2010 | Chen et al. | 438/591 |
| 2010/0072531 A1* | 3/2010 | Kittl et al. | 257/296 |
| 2010/0127336 A1 | 5/2010 | Chambers et al. | |
| 2010/0187644 A1* | 7/2010 | Nabatame | 257/411 |
| 2010/0187982 A1* | 7/2010 | Hsu et al. | 313/504 |
| 2010/0197128 A1 | 8/2010 | Schaeffer et al. | |
| 2010/0258878 A1 | 10/2010 | Mise et al. | |
| 2010/0320547 A1 | 12/2010 | Ando et al. | |
| 2010/0327373 A1 | 12/2010 | Carter et al. | |
| 2011/0127616 A1 | 6/2011 | Hoentschel et al. | |
| 2012/0018810 A1* | 1/2012 | Chambers et al. | 257/369 |
| 2012/0083110 A1* | 4/2012 | Huguenin et al. | 438/591 |
| 2012/0119204 A1 | 5/2012 | Wong et al. | |
| 2012/0280288 A1* | 11/2012 | Ando et al. | 257/288 |

OTHER PUBLICATIONS

Kamimuta et al., "Systematic Study of Vfb Shift in Stacked High-k Bi-layers with Cycle-by-Cycle ALD" Presentation at the ALD 2007 Conference, Jun. 27, 2007 (18 pp).

R. I. Hegde, et al., "Microstructure Modified HfO2 Using Zr Addition With TaxCy Gate for Improved Device Performance and Reliability", IEEE, 2005, (4 pages).

C. Zhao, et al., "Crystallization and Tetragonal-Monoclinic Transformation in ZrO2 and HfO2 Dielectric Thin Films", Key Engineering Materials vols. 206-213 (2002), pp. 1285-1288.

Y. Kuo, et al., "Sub 2 NM Thick Zirconium Doped Hafnium Oxide High-K Gate Dielectrics", ECS Transactions, The Electrochemical Society, 2006, pp. 447-454.

Kyoung-Ryul Yoon, et al., "Performance and Reliability of MIM (Metal-Insulator-Metal Capacitors With ZrO2 for 50nm DRAM Application", Extended Abstracts of the 2005 International Conference on Solid State Devices and Materials, Kobe, 2005, pp. 188-189.

Hyoungsub Kim, et al., "Comparative Study on Electrical and Microstructural Characteristics of ZrO2 and HfO2 Grown by Atomic Layer Deposition", J. Mater. Res., vol. 20, No. 11, Nov. 2005, .COPYRGT. Material Research Society, pp. 3125-3132.

Y. Kuo, et al., "Sub 2 nm Thick Zirconium Doped Hafnium Oxide High-K Gate Dielectrics", 208th ECS Meeting (Oct. 19, 2005), Abstract #548, 1 page.

Tsunehiro Ino, et al., "Dielectric Constant Behavior of Oriented Tetragonal Zr-Si-O System", Extended Abstracts of the 2006 International Conference on Solid State Devices and Materials, Yokohama 2006, pp. 404-405.

Xinyuan Zhao, et al., "Phonons and Lattice Dielectric Properties of Zirconia", Physical Review B. vol. 65 (2002), pp. 075105-1-075105-10.

G. M. Rignanese, et al., "First-Principles Investigation of High-K Dielectrics: Comparison Between the Silicates and Oxides of Hafnium and Zirconium", Physical Review B 69, 2004, pp. 184301-1-184301-10.

H. Y. Yu, et al., "Physical and Electrical Characteristics of HfN Gate Electrode for Advanced MOS Devices", IEEE Electron Device Letters, vol. 24, No. 4, Apr. 2003, pp. 230-232.

Kamimuta et al., "Systematic Study of Vfb Shift in Stacked High-k Bi-layers with Cycle-by-Cycle ALD", Abstract, 7th International Conference on Atomic Layer Deposition, Jun. 24-27, 2007, San Diego, CA (1 pp).

U.S. Appl. No. 13/215,431, filed Aug. 23, 2011.

U.S. Appl. No. 13/436,552, filed Mar. 30, 2012.

U.S. Appl. No. 13/656,537, filed Oct. 19, 2012.

Choi et al. "Scaling equivalent oxide thickness with flat band voltage (Vfb) modulation using in situ Ti and Hf interposed in a metal/high-k gate stack," Journal of Applied Physics 108 (2010) pp. 064107-1-064107-4.

Ando et al. "Ultimate EOT Scaling (<5A) Using Hf-based High-k Gate Dielectrics and Impact on Carrier Mobility," ECS Transactions 28(1) (2010) pp. 115-123.

* cited by examiner

METHOD OF FORMING THIN METAL AND SEMI-METAL LAYERS BY THERMAL REMOTE OXYGEN SCAVENGING

FIELD OF INVENTION

The present invention relates to semiconductor manufacturing and semiconductor devices, and more particularly to a method of forming thin metal and semi-metal layers by thermal remote oxygen scavenging.

BACKGROUND OF THE INVENTION

Metal layers and semi-metal layers are extensively used in semiconductor devices, micro electro mechanical systems (MEMS) that are built into semiconductor chips, photovoltaics (PVs), and other integrated devices. These layers are frequently deposited by physical vapor deposition (PVD) or ionized PVD but those plasma processes can damage underlying layers and substrates. Non-plasma, thermal deposition processes such as chemical vapor deposition (CVD) and atomic layer deposition (ALD) are preferred for many applications but those processes have not been demonstrated for many chemical elements of the Periodic Table.

Accordingly, a need exists for an new method for forming metal layers and semi-metal layers on sensitive substrates by non-plasma, thermal processing that is capable of forming those layers without damage to the substrates. The new methods should include processes that can be easily integrated with semiconductor manufacturing schemes.

SUMMARY OF THE INVENTION

A method is provided for forming thin metal and semi-metal layers on a substrate by thermal remote oxygen scavenging.

According to one embodiment, the method includes forming an oxide layer containing a metal or a semi-metal on a substrate, where the semi-metal excludes silicon, forming a diffusion layer on the oxide layer, forming an oxygen scavenging layer on the diffusion layer; and performing an anneal that reduces the oxide layer to a corresponding metal or semi-metal layer by oxygen diffusion from the oxide layer to the oxygen scavenging layer.

According to another embodiment, the method includes forming a $TiO_2$ layer on the substrate, forming a diffusion layer on the $TiO_2$ layer, the diffusion layer containing a high-k layer abutting the $TiO_2$ layer and a TiN layer abutting the high-k layer, forming an oxygen scavenging layer on the diffusion layer, and performing an anneal that reduces the $TiO_2$ layer to a Ti layer metal by oxygen diffusion from the $TiO_2$ layer to the oxygen scavenging layer.

According to yet another embodiment, the method includes forming an oxide layer containing a metal or a semi-metal on the substrate, where the semi-metal excludes silicon, forming a diffusion layer on the oxide layer, forming an oxygen scavenging layer on the diffusion layer, and performing an anneal that partially reduces the oxide layer by oxygen diffusion from the oxide layer to the oxygen scavenging layer.

DETAILED DESCRIPTION OF SEVERAL EMBODIMENTS

Figure 1:
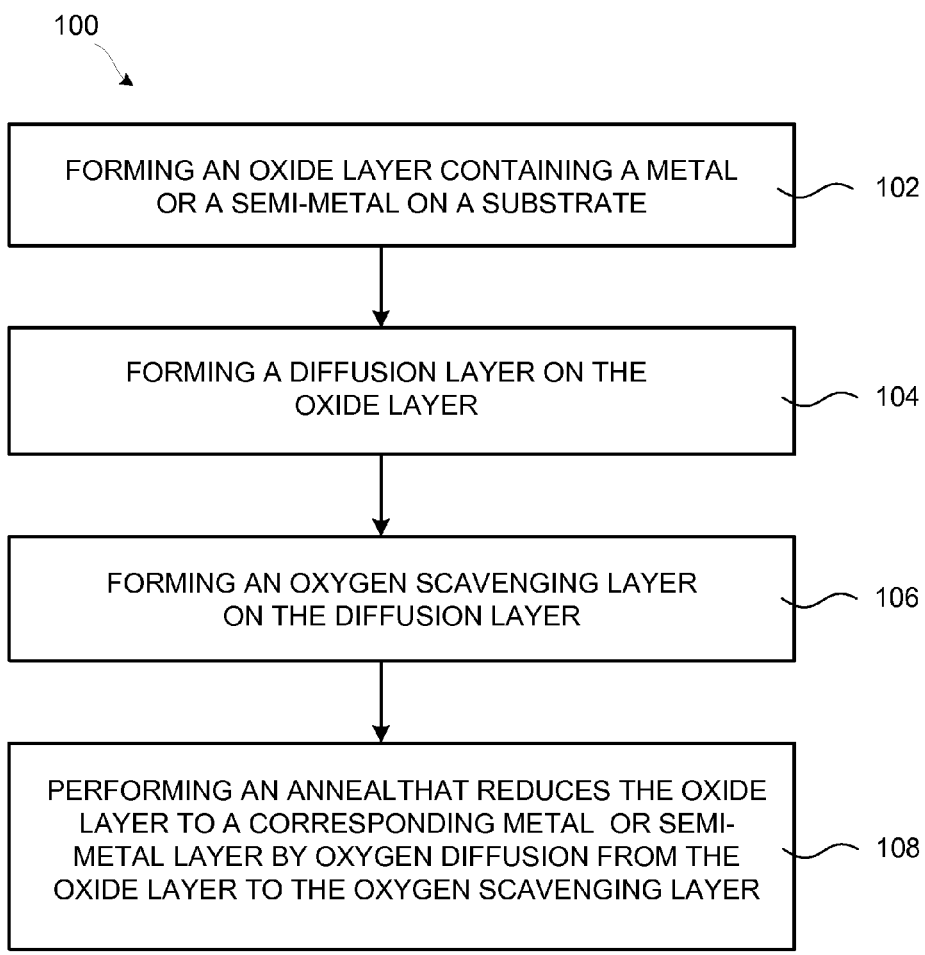
FIG. 1 is a process flow diagram for forming a thin metal or semi-metal layer on a substrate by thermal remote oxygen scavenging according to embodiments of the invention.

Embodiments of the invention describe methods of forming thin metal and semi-metal layers on a substrate using thermal remote oxygen scavenging that removes oxygen from an oxide layer containing the metal or semi-metal, thereby forming the corresponding metal or semi-metal layer. According to one embodiment, the method includes forming an oxide layer containing a metal or a semi-metal on a substrate, where the semi-metal excludes silicon, forming a diffusion layer over the oxide layer, forming an oxygen scavenging layer over the diffusion layer, and performing an anneal that reduces the oxide layer to a corresponding metal or semi-metal layer by oxygen diffusion from the oxide layer through the diffusion layer to the oxygen scavenging layer.

One skilled in the relevant art will recognize that the various embodiments may be practiced without one or more of the specific details described herein, or with other replacement and/or additional methods, materials, or components. In other instances, well-known structures, materials, or operations are not shown or described in detail herein to avoid obscuring aspects of various embodiments of the invention. Similarly, for purposes of explanation, specific numbers, materials, and configurations are set forth herein in order to provide a thorough understanding of the invention. Furthermore, it is understood that the various embodiments shown in the figures are illustrative representations and are not drawn to scale.

Table I shows relative reducing capabilities of several elements of the Periodic Table. The list of elements in Table I is non-exhaustive and can readily be expanded to include additional elements of the Periodic Table. The relative reducing capabilities were obtained by calculating the Gibbs free energy per oxygen atom for the reduction of $SiO_2$ to Si by a particular element at a temperature of 298 K, and then referencing the calculated Gibbs free energy to the element in Table I having the lowest reducing capability (As (gray)). A first element with a higher reducing capability is capable of reducing an oxide of a second element with a lower reducing capability to the corresponding unoxidized second element through thermal remote oxygen scavenging.

According to embodiments of the invention, the relative reducing capabilities may be used to select a layer of a first element (i.e., an oxygen scavenging layer) for chemically reducing an oxide layer of a second element to form a chemically reduced layer of the second element and an oxidized layer of the first element. The chemical reduction of the oxide layer is enabled by performing an anneal that results in oxygen diffusion from the oxide layer through a diffusion layer to the oxygen scavenging layer. In one example, a first element may be chosen that has a relative reducing capacity that is at least 50 relative reducing capability units higher than the second element.

In some cases, the anneal may only partially reduce the oxide layer and form a partially reduced oxide layer containing a stable suboxide of the oxide layer, thereby preventing complete reduction of the oxide layer to the corresponding metal or semi-metal layer. A suboxide (e.g., $B_6O$, $Rb_9O_2$, $Cs_{11}O_3$) contains less oxygen than the common oxide formed by an element. If a partially reduced oxide layer containing a stable suboxide is formed, a new second oxygen scavenging layer containing a chemical element with a higher relative reducing capability than a chemical element of the oxygen scavenging layer may be chosen and formed on the partially reduced oxide layer. Thereafter a second anneal may be performed to further reduce the partially reduced oxide layer to the corresponding metal or semimetal layer by oxygen diffusion from the partially reduced oxide layer to the second oxygen scavenging layer. Thereafter, the second oxygen scavenging layer may be removed from the substrate. In one embodiment, the oxygen scavenging layer and optionally the diffusion layer may be removed from the substrate before the second oxygen scavenging layer is formed over the partially reduced oxide layer. If the diffusion layer is removed from the substrate before the second oxygen scavenging layer is formed over the partially reduced oxide layer, a second diffusion layer may be formed on the partially reduced oxide layer prior to forming the second oxygen scavenging layer.

According to one embodiment, a $TiO_2$ layer may be thermally reduced to a Ti metal layer using an oxygen scavenging layer containing Zr, Hf, Al, or Li, or a combination thereof. Non-plasma, thermal deposition processes such as CVD and ALD have not been demonstrated for Ti metal and embodiments of the invention provide a method of forming a thin Ti metal layer by thermal remote oxygen scavenging on many different types of substrates.

TABLE I

| Element | Oxide | Relative Reducing Capability | Element | Oxide | Relative Reducing Capacity |
|---------|-------|------------------------------|---------|-------|----------------------------|
| Sc | $Sc_2O_3$ | 900 | Zr | $ZrO_2$ | 730 |
| Y | $Y_2O_3$ | 898 | Ti | $TiO_2$ | 576 |
| Ca | CaO | 894 | Si | $SiO_2$ | 543 |
| Er | $Er_2O_3$ | 893 | B | $B_2O_3$ | 483 |
| Lu | $Lu_2O_3$ | 880 | Ta | $Ta_2O_5$ | 452 |
| Dy | $Dy_2O_3$ | 868 | Na | $Na_2O$ | 438 |
| Sm | $Sm_2O_3$ | 843 | Ga | $Ga_2O_3$ | 353 |
| Mg | MgO | 826 | Zn | ZnO | 328 |
| Ce | $Ce_2O_3$ | 825 | Cs | $Cs_2O$ | 303 |
| La | $La_2O_3$ | 824 | In | $In_2O_3$ | 241 |
| Sr | SrO | 811 | Ge | $GeO_2$ | 208 |
| Li | $Li_2O$ | 809 | Co | CoO | 115 |
| Hf | $HfO_2$ | 775 | Sb | $Sb_2O_5$ | 19 |
| Al | $Al_2O_3$ | 742 | As (gray) | $As_2O_5$ | 0 |

FIG. 1 is a process flow diagram 100 for forming a thin metal or a semi-metal layer on a substrate by thermal remote oxygen scavenging according to embodiments of the invention. Referring also to FIGS. 2A-2H, FIG. 2A schematically shows a substrate 210 that may contain a bulk silicon substrate, a single crystal silicon (doped or undoped) substrate, a semiconductor on insulator (SOI) substrate, or any other substrate having a semiconductor material including, for example, Si, SiC, SiGe, SiGeC, Ge, GaAs, InAs, InP, as well as other III/V or II/VI compound semiconductors or any combinations thereof. According to one embodiment, the substrate 210 may contain Ge or $Si_xGe_{1-x}$ compounds, where x is the atomic fraction of Si, 1-x is the atomic fraction of Ge, and $0<1-x<1$. In one example, the substrate 210 can contain a compressive-strained Ge layer or a tensile-strained $Si_xGe_{1-x}$ ($x>0.5$) deposited on a relaxed $Si_{0.5}Ge_{0.5}$ buffer layer. The substrate 210 can be of any size, for example a 200 mm substrate, a 300 mm substrate, or an even larger substrate. In one example, the substrate 210 can include a tensile-strained Si layer. The substrate 210 is not limited to semiconductor materials as other materials such as glasses, metals, and metal-containing materials may also be used.

In step 102, a film structure 201 is formed that contains an oxide layer 212 containing a metal or a semi-metal is formed on the substrate 210. The oxide layer 212 contains an oxidized metal or an oxidized semi-metal (excluding Si) from the Periodic Table. The oxidized metal may be selected from alkali metals, alkali earth metals, transition metals, rare earth metals, and other metals (e.g., Al, Ga, In, Tl, Sn, Pb, Bi). The oxidized semi-metal may be selected from B, Ge, As, Sb, Te, and Po. Examples of the oxide layer 212 include $TiO_2$, $Ta_2O_5$, CoO, $Al_2O_3$, $B_2O_3$, and $Sb_2O_3$.

The oxide layer 212 may include a fully oxidized or a partially oxidized metal or semi-metal layer. A partially oxidized metal or semi-metal layer can contain a non-stoichiometric compound (e.g., $Fe_{0.95}O$) with an elemental composition that cannot be represented by integers. Further, the oxide layer 212 can include a metal or semi-metal layer having an oxidized surface portion (e.g., $TiO_x$, $x>0$) and a non-oxidized interior portion (e.g., Ti metal). The oxidized surface portion may be formed by oxygen exposure during or following deposition of the oxide layer 212.

The oxide layer 212 may be deposited on the substrate 210 by any known deposition method, for example by chemical vapor deposition (CVD), atomic layer deposition (ALD), plasma-enhanced CVD (PECVD), plasma-enhanced ALD (PEALD), physical vapor deposition (PVD), ionized PVD (iPVD), evaporation, or wet deposition. The oxide layer 212 can, for example, have a thickness between about 0.5 nanometers (nm) and about 20 nm, between about 0.5 nm and about 2 nm, between about 2 nm and about 5 nm, or between about 5 nm and about 20 nm. In some examples, the oxide layer 212 can have a thickness of less than about 20 nm, less than about 10 nm, less than about 5 nm, less than about 2 nm, or less than 1 nm. However, in some embodiments the oxide layer 212 may be thicker than about 20 nm.

Figure 2A:
FIGS. 2A-2H show schematic cross-sectional views of a process flow for forming a thin metal or semi-metal layer on a substrate by thermal remote oxygen scavenging according to embodiments of the invention.
Figure 2B:
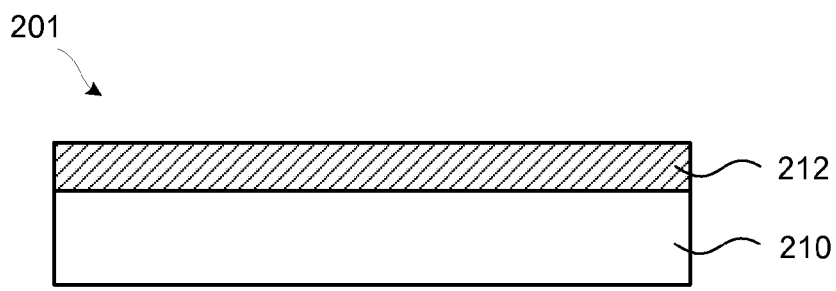
Figure 2C:
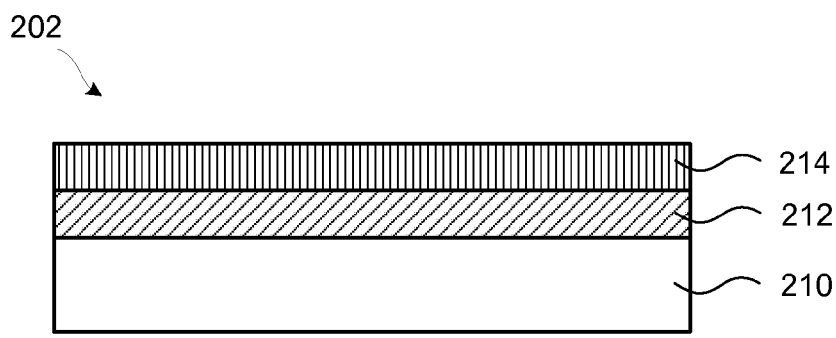
Figure 2D:
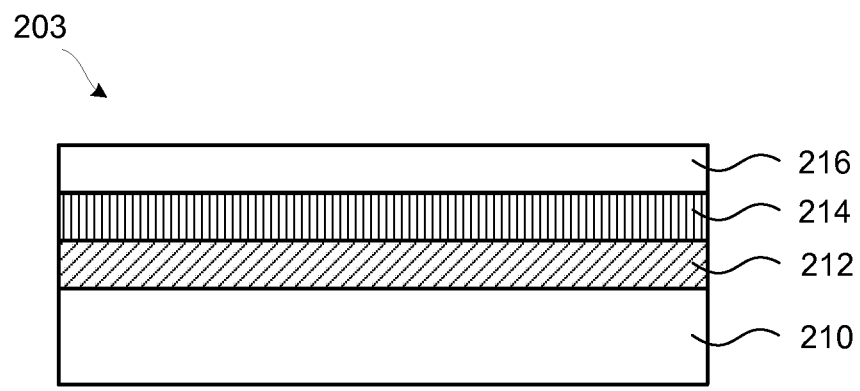

In step 104, a film structure 202 is formed that includes a diffusion layer 214 on the oxide layer 212. According to some embodiments, the diffusion layer 214 can contain a buffer layer, a cap layer, or a laminate containing both a buffer layer and a cap layer. In the embodiment shown in FIG. 2C, the diffusion layer 214 contains a buffer layer or a cap layer. As depicted in FIG. 2C, the diffusion layer 214 can include buffer layer or a cap layer that is in direct contact with the oxide layer 212. In the embodiment schematically shown in FIG. 2H, the diffusion layer 214 contains a buffer layer 222 that is positioned between the oxide layer 212 and a cap layer 224 and abuts the oxide layer 212.

According to some embodiments, the diffusion layer 214 can include a buffer layer that contains a high-k oxide, a high-k nitride, a high-k oxynitride, or a high-k silicate. The buffer layer can contain hafnium, zirconium, or hafnium and zirconium, including hafnium oxide ($HfO_2$), hafnium oxynitride (HfON), hafnium silicate (HfSiO), hafnium silicon oxynitride (HfSiON), zirconium oxide ($ZrO_2$), zirconium oxynitride (ZrON), zirconium silicate (ZrSiO), zirconium silicon oxynitride (ZrSiON), hafnium zirconium oxide ($HfZrO_2$), hafnium zirconium oxynitride (HfZrON), hafnium zirconium silicate (HfZrSiO), hafnium zirconium silicon oxynitride (HfZrSiON), or a combination of two or more thereof.

According to some embodiments, the diffusion layer 214 can include a buffer layer containing an oxide, nitride, oxynitride, or titanate layer containing one or more elements selected from alkali earth metals and elements selected from rare earth metals of the Periodic Table. Rare earth metals include yttrium (Y), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), and lutetium (Lu). Examples of rare earth metal oxides include yttrium oxide ($Y_2O_3$), lanthanium oxide ($La_2O_3$) and lutetium oxide ($Lu_2O_3$). Examples of titanate layers include barium titanate ($BaTiO_3$), strontium titanate ($SrTiO_3$), and barium strontium titanate ($BaSrTiO_3$).

According to some embodiments, the diffusion layer 214 can include a high-k material doped with a rare earth metal element or an alkali earth metal element that increases oxygen diffusion through the diffusion layer 214. The doped high-k material can, for example, contain a hafnium based material, a zirconium based material, or a hafnium zirconium based material. Non-limiting examples include yttrium doped zirconium oxide ($YZrO_2$) and yttrium doped hafnium oxide ($YHfO_2$).

The diffusion layer 214 can include a cap layer 224 that contains a metal nitride layer (e.g., TiN, TaN, or WN), a metal carbide layer (e.g., TiC, TaC, or WC), or a metal carbonitride layer (e.g., TiCN, TaCN, or WCN), or combination thereof. An as-deposited cap layer may be crystalline (e.g., polycrystalline) or amorphous, but an amorphous cap layer may crystallize during a subsequent annealing process. A crystalline or polycrystalline cap layer (e.g., a polycrystalline or crystalline TiN layer) may allow more efficient oxygen diffusion through grain boundaries in the cap layer, compared to an amorphous cap layer.

The diffusion layer 214 may be deposited by CVD, ALD, PECVD, PEALD, PVD, IPVD, evaporation, or wet deposition. The diffusion layer 214 can, for example, have a thickness between about 0.5 nm and about 20 nm, between about 0.5 nm and about 2 nm, between about 2 nm and about 5 nm, or between about 5 nm and about 20 nm. In some examples, the diffusion layer 214 can have a thickness of less than about 20 nm, less than about 10 nm, less than about 5 nm, less than about 2 nm, or less than 1 nm. However, in some embodiments the diffusion layer 214 may be thicker than about 20 nm.

In step 106, a film structure 203 is formed that includes an oxygen scavenging layer 216 formed on the diffusion layer 214. The diffusion layer 214 separates the oxide layer 212 from the oxygen scavenging layer 216 and prevents or reduces intermixing of the oxide layer 212 and the oxygen scavenging layer 216. The oxygen scavenging layer 216 contains an element that is capable of reducing the oxide layer 212 to the corresponding metal or semi-metal layer. The element capable of reducing the oxide layer 212 may be selected from Table I, where the element has a higher reducing capability than the element of the oxide layer 212. The oxygen scavenging layer 216 may include a metal in an elemental form. According to some embodiments of the invention, the oxygen-scavenging layer can contain Sc, Zr, Hf, Ca, Sr, Ba, Y, La, Ce, Pr, Nd, Pm, Sm, Eu, Gd, Tb, Dy, Ho, Er, Tm, Yb, or Lu, or a combination thereof.

The oxygen scavenging layer 216 may be deposited by CVD, ALD, PECVD, PEALD, PVD, IPVD, evaporation, or wet deposition. The oxygen scavenging layer 216 can, for example, have a thickness between about 0.5 nm and about 20 nm, between about 0.5 nm and about 2 nm, between about 2 nm and about 5 nm, or between about 5 nm and about 20 nm. In some examples, the oxygen scavenging layer 216 can have a thickness of less than about 20 nm, less than about 10 nm, less than about 5 nm, less than about 2 nm, or less than 1 nm. However, in some embodiments the oxygen scavenging layer 216 may be thicker than about 20 nm.

Figure 2E:
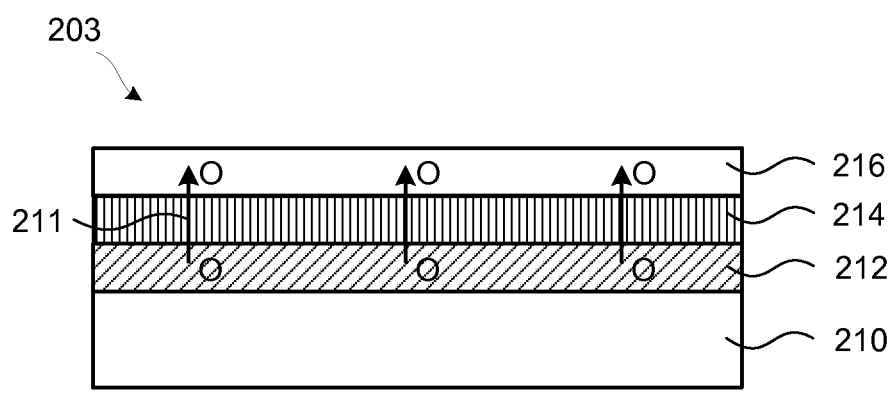

In step 108, an anneal is performed that reduces the oxide layer 212 to a corresponding metal layer or semi-metal layer by oxygen diffusion 211 from the oxide layer 212 through the diffusion layer 214 to the oxygen scavenging layer 216. This is schematically shown in FIG. 2E. The oxygen diffusion 211 is enabled by the annealing and the relative reducing capabilities of the oxygen scavenging layer 216 and the oxide layer 212.

Figure 2F:
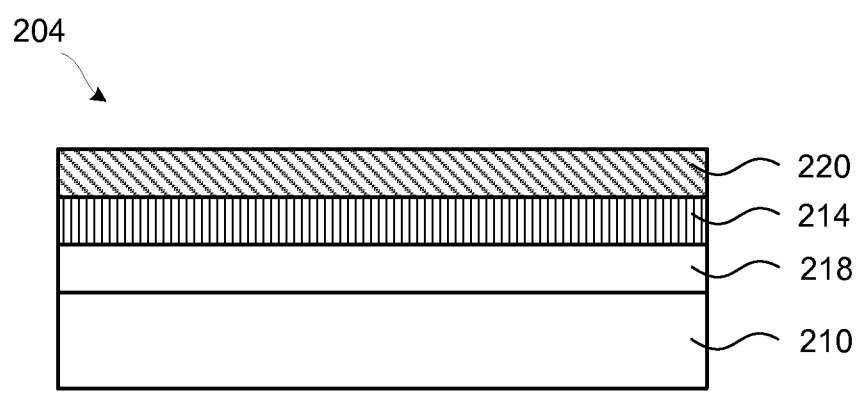

As schematically shown in FIG. 2F, the anneal in step 108 forms a film structure 204 containing an oxidized oxygen scavenging layer 220 and a metal or semi-metal layer 218. The anneal may be performed at a temperature between about 100° C. and about 1400° C., for example between about 100° C. and about 300° C., between about 300° C. and about 500° C., between about 500° C. and about 700° C., between about 700° C. and about 900° C., between about 900° C. and about 1000° C., between about 1000° C. and about 1200° C., or between about 1200° C. and about 1400° C. The anneal may be performed in a reduced pressure atmosphere that contains an inert gas, a reducing, or a combination of an inert gas and a reducing gas. For example, an inert gas may contain Ar, He, or $N_2$) and a reducing gas may contain $H_2$.

In some cases, the anneal in step 108 may only partially reduce the oxide layer 212 to a layer containing stable suboxides of the oxide layer 212, thereby preventing complete reduction to the metal or semi-metal of interest. A suboxide contains less oxygen than the common oxide formed by an element (e.g., $C_2O_3$). In these cases a new reducing layer element with greater relative reducing capability may be chosen.

In one example, the oxide layer 212 can contain $TiO_2$, the diffusion layer 214 can contain a buffer layer containing $ZrO_2$ or $HfO_2$ on the $TiO_2$, and the oxygen scavenging layer 216 can contain any element of the Periodic Table having a higher relative reducing capability than Ti. Some elements with higher relative reducing capability than Ti are listed in Table 1. Further, a cap layer containing TiN layer may be present between the buffer layer and the oxygen scavenging layer 216. In this example, the buffer layer reduces or prevents intermixing of the $TiO_2$ and the TiN.

Figure 2G:
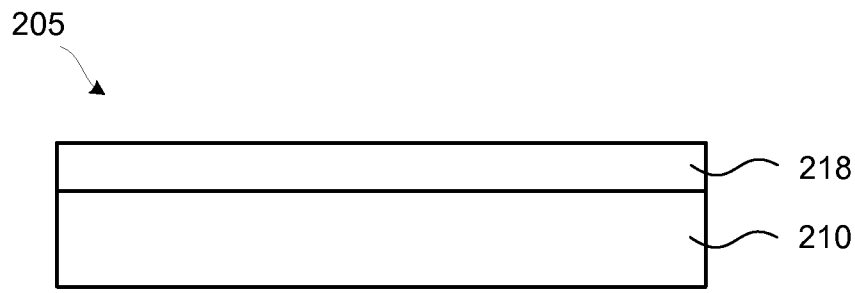
Figure 2H:
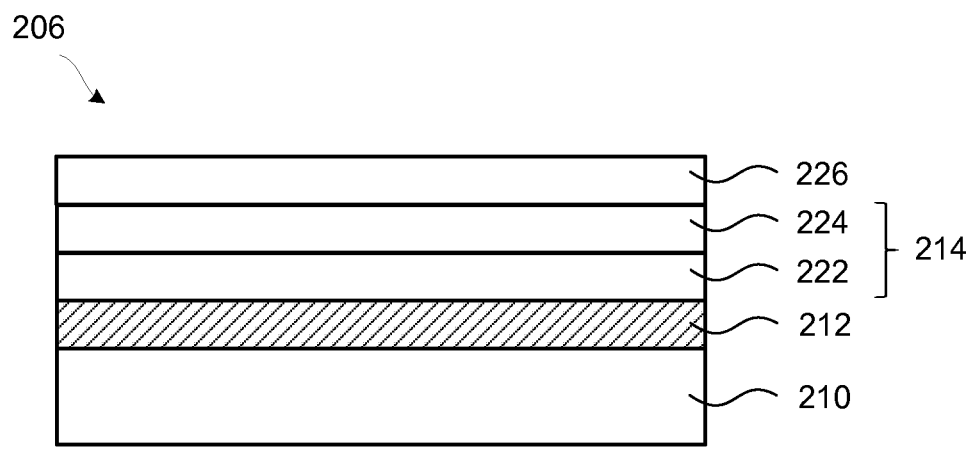

Following the anneal in step 108, the oxidized oxygen scavenging layer 220 and the diffusion layer 222 may be removed from the film structure 204 in FIG. 2F to form a film structure 205 containing metal or semi-metal layer 218 on the substrate 210, as shown in FIG. 2G. The oxidized oxygen scavenging layer 220 and the diffusion layer 214 may be removed using standard dry or wet etching methods.

A plurality of embodiments for methods of forming thin metal and semi-metal layers using thermal remote oxygen scavenging have been described. The method enables the formation of many hard to deposit metal layers and semi-metal layers by non-plasma, thermal processing that is capable of depositing those layers without damage to underlying substrates. The methods can easily be integrated with semiconductor manufacturing schemes.

The foregoing description of the embodiments of the invention has been presented for the purposes of illustration and description. It is not intended to be exhaustive or to limit the invention to the precise forms disclosed. This description and the claims following include terms that are used for descriptive purposes only and are not to be construed as limiting. For example, the term "on" as used herein (including in the claims) does not require that a film "on" a substrate is directly on and in immediate contact with the substrate; there may be a second film or other structure between the film and the substrate unless otherwise specified.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method of processing a substrate, comprising:
   forming an oxide layer containing a metal or a semi-metal on the substrate, where the semi-metal excludes silicon;
   forming a diffusion layer on the oxide layer;
   forming an oxygen scavenging layer on the diffusion layer;
   performing an anneal that reduces the oxide layer to a corresponding metal or semi-metal layer by oxygen diffusion from the oxide layer to the oxygen scavenging layer; and
   thereafter, removing the diffusion layer and the oxygen scavenging layer from the substrate.

2. The method of claim 1, wherein the oxygen-scavenging layer contains a chemical element with higher reducing capability than the metal or semi-metal of the oxide layer.

3. The method of claim 1, wherein the diffusion layer contains a buffer layer, a cap layer, or a laminate containing a buffer layer and a cap layer.

4. The method of claim 1, wherein the diffusion layer contains a buffer layer that abuts the oxide layer, and a cap layer that abuts the buffer layer.

5. The method of claim 1, wherein the oxide layer contains Ti, Ta, Nb, Ni, Pd, Pt, Fe, Ru, Os, Co, Rh, or Ir, or a combination thereof.

6. The method of claim 1, wherein the oxygen-scavenging layer contains Sc, Zr, Hf, Ca, Sr, Ba, Y, La, Ce, Pr, Nd, Pm, Sm, Eu, Gd, Tb, Dy, Ho, Er, Tm, Yb, or Lu, or a combination thereof.

7. The method of claim 1, wherein the oxide layer contains a non-stoichiometric metal oxide or semi-metal oxide layer.

8. The method of claim 3, wherein the buffer layer contains a high-k oxide, a high-k nitride, a high-k oxynitride, or a high-k silicate, or a combination thereof.

9. The method of claim 3, wherein the cap layer contains a metal nitride layer, a metal carbide layer, or a metal carbonitride layer, or a combination thereof.

10. The method of claim 8, wherein the high-k oxide contains $HfO_2$, $ZrO_2$, or a combination thereof.

11. The method of claim 8, wherein the buffer layer contains an oxide, nitride, oxynitride, or titanate layer containing one or more elements selected from alkali earth metals and rare earth metals.

12. The method of claim 10, wherein the high-k oxide is doped with a rare earth metal element or an alkali earth metal element.

13. A method of processing a substrate, comprising:
    forming an oxide layer containing a metal;
    forming a diffusion layer on the oxide layer;
    forming an oxygen scavenging layer on the diffusion layer; and
    performing an anneal that reduces the oxide layer to a corresponding metal layer by oxygen diffusion from the oxide layer to the oxygen scavenging layer,
    wherein the oxide layer contains $TiO_2$ and the diffusion layer contains 1) at least one of $HfO_2$ and $ZrO_2$ that abut the oxide layer and 2) a TiN layer that abuts the oxygen scavenging layer.

14. The method of claim 13, wherein the oxygen-scavenging layer contains a chemical element with higher reducing capability than the metal of the oxide layer.

15. The method of claim 13, further comprising:
    following the performing an anneal that reduces the $TiO_2$ layer, removing the diffusion layer and the oxygen scavenging layer.

16. The method of claim 13, wherein the oxygen-scavenging layer contains Zr, Hf, Al, or Li, or a combination thereof.

17. A method of processing a substrate, comprising:
    forming a $TiO_2$ layer on the substrate;
    forming a diffusion layer on the $TiO_2$ layer, the diffusion layer containing a high-k layer abutting the $TiO_2$ layer and a TiN layer abutting the high-k layer;
    forming an oxygen scavenging layer on the diffusion layer; and
    performing an anneal that reduces the $TiO_2$ layer to a Ti layer by oxygen diffusion from the $TiO_2$ layer to the oxygen scavenging layer.

18. The method of claim 17, wherein the oxygen-scavenging layer contains a chemical element with higher reducing capability than Ti.

19. The method of claim 17, further comprising:
    following the performing an anneal that reduces the $TiO_2$ layer, removing the diffusion layer and the oxygen scavenging layer.

20. The method of claim 17, wherein the oxygen-scavenging layer contains Zr, Hf, Al, or Li, or a combination thereof.

21. The method of claim 17, wherein the diffusion layer includes a high-k layer containing at least one of $HfO_2$ and $ZrO_2$ that abuts the oxide layer and a crystalline or a polycrystalline TiN layer that abuts the high-k layer.

* * * * *